(12) United States Patent
Mosley et al.

(10) Patent No.: US 8,277,894 B2
(45) Date of Patent: Oct. 2, 2012

(54) SELENIUM INK AND METHODS OF MAKING AND USING SAME

(75) Inventors: David Mosley, Philadelphia, PA (US); Kevin Calzia, Philadelphia, PA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 610 days.

(21) Appl. No.: 12/504,062

(22) Filed: Jul. 16, 2009

(65) Prior Publication Data

US 2011/0014377 A1    Jan. 20, 2011

(51) Int. Cl.
    B05D 5/00      (2006.01)
    C09D 11/00     (2006.01)
    H01L 21/336    (2006.01)

(52) U.S. Cl. .............. 427/256; 106/1.05; 106/31.13; 106/31.92; 252/500; 257/42; 257/E21.068; 257/E21.114; 257/E21.09; 257/E29.296; 427/76; 427/380; 427/384; 438/95; 438/102; 438/197; 438/285; 438/478; 438/590; 438/602

(58) Field of Classification Search ............ 106/1.05, 106/31.13, 31.92; 136/262; 252/500, 512; 257/42, E21.09, E21.068, E21.633, E21.114, 257/E21.411, E29.296; 427/76, 384, 256, 427/380; 438/95, 102, 104, 197, 285, 478, 438/483, 502, 590, 603, 602
See application file for complete search history.

(56) References Cited

U.S. PATENT DOCUMENTS

| | | | |
|---|---|---|---|
| 4,520,010 A | 5/1985 | Badesha et al. | |
| 6,518,086 B2 | 2/2003 | Beck et al. | |
| 6,875,661 B2 | 4/2005 | Mitzi et al. | |
| 7,094,651 B2 * | 8/2006 | Mitzi et al. | 438/285 |
| 7,163,835 B2 | 1/2007 | Meth | |
| 7,341,917 B2 | 3/2008 | Millron et al. | |
| 7,494,841 B2 | 2/2009 | Mitzi et al. | |
| 2007/0166453 A1 | 7/2007 | VanDuren et al. | |
| 2008/0124831 A1 | 5/2008 | Robinson et al. | |
| 2008/0280030 A1 | 11/2008 | VanDuren et al. | |
| 2009/0025640 A1 | 1/2009 | Sager et al. | |
| 2009/0145482 A1 | 6/2009 | Mitzi et al. | |

FOREIGN PATENT DOCUMENTS

| WO | 9304212 | 3/1993 |
|---|---|---|
| WO | 2008057119 | 5/2008 |
| WO | 2008063190 | 5/2008 |

OTHER PUBLICATIONS

Mitzi, et al., A high-efficiency solution-deposited thin-film photovoltaic device, Advanced Materials, vol. 20, pp. 3657-3662 (2008).
Mitzi, et al., Low-voltage transistor employing a high-mobility spin-coated chalcogenide semiconductor, Advanced Materials, vol. 17, pp. 1285-1289 (2005).
Lu, et al., Study of the dissolution behavior of selenium and tellurium in different solvents—a novel route to Se, Te tubular bulk single crystals, Journal of Materials Chemistry, vol. 12, (2002).
Chichibu, et al. Use of diethylselenide as a less-hazardous source for preparation of CuInSe2 photo-absorbers by selenization of metal precursors, Journal of Crystal Growth, vol. 243, (2002).
Kemell, et al., Thin film deposition methods for CuInSe2 solar cells, Critical Reviews in Solid State and Materials Sciences, vol. 30, pp. 1-31 (2005).
Pejova, et al., Chemical deposition and characterization of and $Cu_2Se$ thin films, Journal of Solid State Chemistry, 158, pp. 49-54 (2001).
Kanatzidis, et al., Coordination chemistry of heavy polychalcogenide ligands, Coordination Chemistry Reviews, vol. 130, pp. 509-621 (1994).

* cited by examiner

*Primary Examiner* — Bijan Ahvazi
(74) *Attorney, Agent, or Firm* — Thomas S. Deibert

(57) ABSTRACT

A selenium ink comprising selenium stably dispersed in a liquid medium is provided, wherein the selenium ink is hydrazine free and hydrazinium free. Also provided are methods of preparing the selenium ink and of using the selenium ink to deposit selenium on a substrate for use in the manufacture of a variety of chalcogenide containing semiconductor materials, such as, thin film transistors (TFTs), light emitting diodes (LEDs); and photo responsive devices (e.g., electrophotography (e.g., laser printers and copiers), rectifiers, photographic exposure meters and photo voltaic cells) and chalcogenide containing phase change memory materials.

9 Claims, No Drawings

SELENIUM INK AND METHODS OF MAKING AND USING SAME

The present invention relates to a selenium ink comprising selenium stably dispersed in a liquid medium. The present invention further relates to a method of preparing the selenium ink and for using the selenium ink to deposit selenium on a substrate.

Selenium is deposited onto substrates for use in a variety of chalcogenide containing semiconductor materials, for example, thin film transistors (TFTs), light emitting diodes (LEDs); and photo responsive devices {e.g., electrophotography (e.g., laser printers and copiers), rectifiers, photographic exposure meters and photo voltaic cells}. Selenium is also deposited onto substrates for use in the manufacture of phase change alloys for use in phase change memory devices.

One very promising application for selenium is in the manufacture of photo voltaic cells for the conversion of sunlight into electricity. In particular, the use of selenium in the manufacture of photo voltaic cells based on Group 1a-1b-3a-6a mixed-metal chalcogenide materials, including for example, copper-indium-diselenide ($CuInSe_2$), copper-gallium-diselenide ($CuGaSe_2$) and copper-indium-gallium-diselenide ($CuIn_{1-x}Ga_xSe_2$), are of considerable interest because of their high solar energy to electrical energy conversion efficiencies. The Group 1a-1b-3a-6a mixed metal chalcogenide semiconductors are sometimes referred to generically as CIGS materials. Conventional CIGS solar cells include a back electrode followed by a layer of molybdenum, a CIGS absorber layer, a CdS junction partner layer, and a transparent conductive oxide layer electrode (e.g., $ZnO_x$ or $SnO_2$); wherein the molybdenum layer is deposited over the back electrode, the CIGS absorber layer is interposed between the molybdenum layer and the CdS junction partner and the CdS junction partner is interposed between the CIGS absorber layer and the transparent conductive oxide layer electrode.

The CIGS absorber layer used in photo voltaic devices contain an excess of selenium relative to the other constituents of that layer. One challenge for this promising application for selenium is the development of cost-effective manufacturing techniques for producing the CIGS materials. Conventional methods for depositing selenium typically involve the use of vacuum-based processes, including, for example, vacuum-evaporation, sputtering and chemical vapor deposition. Such deposition techniques exhibit low throughput capabilities and high cost. To facilitate the large scale, high throughput, low cost, manufacture of selenium containing semiconductor materials (in particular CIGS materials), it would be desirable to provide solution based selenium deposition techniques.

One solution deposition method for depositing selenium in the manufacture of a CIGS material is disclosed by Mitzi, et al. in *A High-Efficiency Solution-Deposited Thin-Film Photovoltaic Device*, ADVANCED MATERIALS, vol. 20, pp. 3657-62 (2008) ("Mitzi I"). Mitzi I discloses the use of a selenium ink comprising hydrazine, inter alia, as a liquid vehicle for depositing selenium in the manufacture of a thin film CIGS layer. Hydrazine, however, is a highly toxic and explosive material. Accordingly, the Mitzi I process has limited value for use in the large scale manufacture of selenium containing semiconductor devices.

An alternative to the hydrazine containing selenium ink described in Mitzi I is disclosed by Mitzi, et al. in *Low-Voltage Transistor Employing a High-Mobility Spin-Coated Chalcogenide Semiconductor*, ADVANCED MATERIALS vol. 17, pp. 1285-89 (2005) ("Mitzi II"). Mitzi II discloses the use of a hydrazinium precursor material for deposition of indium selenide to form an indium selenide channel of a thin film transistor. Mitzi II further asserts that its hydrazinium approach is likely extendable to other chalcogenides besides $SnS_{2-x}Se_x$, $GeSe_2$, and $In_2Se_3$ systems.

The hydrazinium precursor materials disclosed by Mitzi II remove hydrazine from the manufacturing step to produce selenium containing semiconductor films. Notwithstanding, Mitzi II does not eliminate the need for hydrazine. Rather, Mitzi II still utilizes hydrazine in the preparation of the hydrazinium precursor materials. Moreover, hydrazinium ion precursors pose a significant explosion risk, as documented by Eckart W. Schmidt in his book, *Hydrazine and Its Derivatives: Preparation, Properties, and Applications*, JOHN WILEY & SONS pp 392-401 (1984). The presence of numerous metal ions exacerbates the risk of hydrazinium explosion or detonation. This can be a problem because residual hydrazinium salts may accumulate in process equipment during manufacture, presenting an unacceptable safety risk. Hence, there remains a need for a hydrazine free, hydrazinium free, selenium containing ink for use in the manufacture of selenium containing semiconductor materials and phase change alloys.

In one aspect of the present invention, there is provided a selenium ink, comprising: a reaction product of: $\geq 1$ wt % selenium; a traceless reducing agent; and a liquid carrier; wherein the selenium ink is a stable dispersion and wherein the selenium ink is hydrazine free and hydrazinium free.

In another aspect of the present invention, there is provided a selenium ink, comprising: a (counterion)selenide complex dispersed in a liquid carrier; wherein the (counterion)selenide complex comprises $\geq 1$ wt % selenium complexed with a counterion selected from an ammonium counterion and an amine counterion; wherein the selenium ink is a stable dispersion; and wherein the selenium ink is hydrazine free and hydrazinium free.

In another aspect of the present invention, there is provided a method for depositing selenium on a substrate, comprising: providing a substrate; providing a selenium ink according to claim 1; applying the selenium ink to the substrate forming a selenium precursor on the substrate; treating the selenium precursor to remove the liquid carrier depositing selenium on the substrate; wherein the selenium deposited on the substrate is a mixture of $Se^0$ and $Se^{1-}$.

In another aspect of the present invention, there is provided a method for preparing a Group 1a-1b-3a-6a material, comprising: providing a substrate; optionally, providing a Group 1a source comprising sodium; providing a Group 1b source; providing a Group 3a source; optionally, providing a Group 6a sulfur source; providing a Group 6a selenium source, wherein the Group 6a selenium source includes a selenium ink of the present invention; forming a Group 1a-1b-3a-6a precursor material on the substrate by optionally using the Group 1a source to apply sodium to the substrate, using the Group 1b source to apply a Group 1b material to the substrate, using the Group 3a source to apply a Group 3a material to the substrate, optionally using the Group 6a sulfur source to apply a sulfur material to the substrate and using the Group 6a selenium source to apply a selenium material to the substrate; treating the precursor material to form a Group 1a-1b-3a-6a material having a formula $Na_LX_mY_nS_pSe_q$; wherein X is at least one Group 1b element selected from copper and silver; Y is at least one Group 3a element selected from aluminum, gallium and indium; $0 \leq L \leq 0.75$; $0.25 \leq m \leq 1.5$; n is 1; $0 \leq p < 2.5$; $0 < q \leq 2.5$; and $1.8 \leq (p+q) \leq 2.5$.

In another aspect of the present invention, there is provided a method for preparing a CIGS material, comprising: providing a substrate; providing a copper source; optionally, providing an indium source; optionally, providing a gallium source; optionally, providing a sulfur source and providing a selenium ink of the present invention; forming a CIGS precursor material on the substrate by depositing a copper material on the substrate using the copper source, optionally depositing an indium material on the substrate using the indium source, optionally depositing a gallium material on the substrate using the gallium source, optionally depositing a sulfur material on the substrate using the sulfur source and depositing a selenium material on the substrate using the selenium ink; treating the CIGS precursor material to form a CIGS material having a formula $Cu_vIn_wG_xSe_yS_z$; wherein $0.5 \leq v \leq 1.5$ (preferably $0.88 \leq v \leq 0.95$), $0 \leq w \leq 1$ (preferably $0.68 \leq w \leq 0.75$, more preferably w is 0.7), $0 \leq x \leq 1$ (preferably $0.25 \leq x \leq 0.32$, more preferably x is 0.3), $0 < y \leq 2.5$; $0 \leq z < 2.5$ and $1.8 \leq (y+z) \leq 2.5$.

DETAILED DESCRIPTION

The term "stable" as used herein and in the appended claims in reference to the selenium ink means that the (counterion)selenide complex dispersed in the selenium ink does not undergo significant growth or aggregation. The (counterion)selenide complex in the stable selenium ink of the present invention remains dispersed in the liquid carrier and can be filtered through a 1.2 micron glass microfiber syringe filter (e.g., Whatman 6886-2512) with no hold up or clogging for a period of at least three weeks following the preparation of the selenium ink. Preferably, the (counterion)selenide complex in the stable selenium ink of the present invention remains dispersed in the liquid carrier and can be filtered through a 0.45 micron PTFE syringe filter with no hold up or clogging for a period of at least two months following the preparation of the selenium ink.

The term "hydrazine free" as used herein and in the appended claims in reference to the selenium ink means that the selenium ink contains <100 ppm hydrazine.

The term "hydrazinium free or $(N_2H_5)^+$ free" as used herein and in the appended claims in reference to the selenium ink means that the selenium ink contains <100 ppm hydrazinium complexed with selenium.

The present invention relates to a selenium ink, the preparation of the selenium ink and the use of selenium ink in the manufacture of selenium containing devices such as thin film transistors (TFTs), light emitting diodes (LEDs); phase change alloys for use in memory devices; and photo responsive devices {e.g., electrophotography (e.g., laser printers and copiers), rectifiers, photographic exposure meters and photo voltaic cells}. The following detailed description focuses on the use of the selenium inks of the present invention in the preparation of CIGS materials designed for use in photo voltaic cells.

The selenium ink of the present invention comprises, a reaction product of: $\geq 1$ wt % selenium; a traceless reducing agent; and a liquid carrier; wherein the selenium ink is a stable dispersion and wherein the selenium ink is hydrazine free and hydrazinium free. Without wishing to be bound by theory, it is believed that the reaction product comprises: a (counterion) selenide complex dispersed in the liquid carrier.

Selenium exhibits a tendency to catenate. As a result, selenium can form polyselenide ions of various sizes (e.g., $Se_{2-8}^{2-}$). The term "formally $^{1-}$ valent selenium or $(Se^{1-})$" as used herein and in the appended claims, refers to individual selenium atoms within a polyselenide ion that exhibit a $^{1-}$ valency. For example, a well known polyselenide dianion species is $Se^{1-}-Se^{0}-Se^{0}-Se^{1-}$; wherein two of the selenium atoms are considered to exhibit a $^{1-}$ valency and the other two selenium atoms are considered to exhibit a $^{0}$ valency. The average ratio of $Se^{0}$ atoms to $Se^{1-}$ atoms in the (counterion)selenide complex can be modified through selection of the reaction conditions and the ratio of selenium to traceless reducing agent employed in the preparation of the (counterion)selenide complex. Note that it is believed that nanoparticles of selenium having a core of $Se^{0}$ atoms surrounded by a shell of $Se^{1-}$ atoms can be present in the selenium ink of the present invention. The presence of such nanoparticles can be determined by various light scattering techniques. Such nanoparticles can exhibit a higher ratio of $Se^{0}$ to $Se^{1-}$ than would be predicted for linear polyselenide species. Notwithstanding, the average ratio of $Se^{0}$ to $Se^{1-}$ in the selenium ink can be controlled through selection of the type and amount of traceless reducing agent employed in the preparation of the selenium ink. Accordingly, if nanoparticulate selenium species (having a higher $Se^{0}$ to $Se^{1-}$ ratio than the predicted ratio of $Se^{0}$ to $Se^{1-}$ for linear polyselenide species) are present, then other selenium species having a lower $Se^{0}$ to $Se^{1-}$ ratio than predicted will also be present. Note that in some selenium inks of the present invention, single selenium atoms can be present which posses a $^{2-}$ valency (i.e., $Se^{2-}$). To maintain the charge neutrality of the (counterion)selenide complex, the polyselenide anion coordinates with a cation or combination of cations. For example, a (counterion)selenide complex comprising the polyselenide dianion species is $Se^{1-}-Se^{0}-Se^{0}-Se^{1-}$ would coordinate with a cation or combination of cations exhibiting a combined total $^{2+}$ valency. Such cationic species can include two monocationic species or a single dicationic species.

It is known that polyselenide species are capable of rearranging in solution or in the solid state. For example, an $Se^{1-}-Se_6^{0}-Se^{1-}$ can rearrange to give a $Se^{2-}$ and a $Se_7^{0}$ ring. This $Se_7^{0}$ ring can remain solubilized by its association with other polyselenide species, or can precipitate to form solid selenium. To further illustrate this phenomina, consider a (counterion)selenide complex comprising two amine counterions (i.e., $(HNR_3)_2^{2+}$) and an $Se^{1-}-Se_6^{0}-Se^{1-}$ polyselenide species. Upon heating of the (counterion)selenide complex, $2NR_3$ will be released, leaving (a) an $H_2Se_8$ (i.e., H—Se—Se—Se—Se—Se—Se—Se—Se—H); or an $H_2Se$ and an $Se_7^{0}$ ring. It is believed that $H^{-}-Se^{1-}$ bonds can participate in the annealing process of a CIGS material by a different mechanism from that of $Se^{0}$ species based on the different valence of the selenium species and the presence of a mobile $H^1$ species.

The counterion (selenide) complex in the selenium ink of the present invention preferably comprises an $Se_a^{2-}$; wherein a is 1 to 20, preferably 2 to 10, more preferably 2 to 8 (e.g., $Se^{1-}-Se^{0}-Se^{0}-Se^{0}-Se^{0}-Se^{1-}$ when a=6).

The selenide content of the selenium ink of the present invention can be selectively provided to suit the particular application need and the processing technology and equipment to be used to apply the selenium ink to a given substrate. Optionally, the selenium ink exhibits a selenide content selected from 1 to 50 wt %; 1 to 5 wt %; 4 to 15 wt % and 5 to 10 wt % (based on the weight of the selenium ink). Optionally, the selenium ink exhibits a selenide content of 1 to 50 wt % (based on the weight of the selenium ink). Optionally, the selenium ink exhibits a selenide content of 1 to 5 wt % (based on the weight of the selenium ink). Optionally, the selenium ink exhibits a selenide content of 4 to 15 wt % (based on the weight of the selenium ink). Optionally, the selenium ink exhibits a selenide content of 5 to 10 wt % (based on the weight of the selenium ink).

The average particle size of the (counterion)selenide complex contained in the selenium ink of the present invention can be selectively provided to suit the particular application need and the processing technology and equipment to be used to apply the selenium ink to a given substrate. The average particle size of the (counterion)selenide complex can be targeted during the preparation of the selenium ink through the selection of starting materials and the methods used to combine the components in preparing the selenium ink. For example, nano- or molecular scale (counterion)selenide complexes can be produced through a complete and thorough reaction with sufficient mixing. Optionally, the average particle size of the (counterion)selenide complexes can be controlled by stopping the reaction short of a complete and thorough reaction, leaving unreacted traceless reducing agent, along with larger particles of (counterion)selenide complexes that are still colloidally stable. Optionally, the (counterion)selenide complex exhibits an average particle size selected from 0.05 to 10 microns; 0.05 to 1 micron; 0.05 to 0.4 micron; 0.1 to 0.4 micron and <1 micron. Optionally, the (counterion)selenide complex exhibits an average particle size of 0.05 to 10 microns. Optionally, the (counterion)selenide complex exhibits an average particle size of 0.05 to 1 micron. Optionally, the (counterion)selenide complex exhibits an average particle size of 0.05 to 0.4 micron. Optionally, the (counterion)selenide complex exhibits an average particle size of 0.4 micron. The average particle size of the (counterion)selenide complex can be selected to, for example: facilitate the deposition of small particle size (counterion)selenide complex when codepositing with Cu, In and or Ga inks in the preparation of a CIGS material to facilitate intimate mixing of the CIGS components; to facilitate clog free spraying of the selenium ink; or to facilitate extended shelf-life of the selenium ink.

Optionally, the selenium ink of the present invention is a charge stabilized suspension. That is, the selenium ink is a heterogeneous fluid, wherein the (counterion)selenide complex comprises a plurality of particles having an average particle size of >1 micron. Preferably, particles of the (counterion)selenide complex contained in the charge stabilized suspension that settle out over time can be readily redispersed. The term "readily redispersible" as used herein and in the appended claims in reference to the selenium ink means that any material settling out of the selenium ink overtime can be redispersed with agitation or sonication (i.e., the settled material does not form persistent agglomerates).

Optionally, the selenium ink is a sol. That is, the selenium ink is a colloidal dispersion, wherein the (counterion)selenide complex comprises a plurality of particles having an average particle size between 1 to 500 nm.

The traceless reducing agent used in the preparation of the selenium ink of the present invention has a molecular weight selected from (a) $\geq 35$ and (b) $<35$; wherein traceless reducing agent having a molecular weight $<35$ has a molecular formula with $\leq 1$ nitrogen atom. Optionally, the traceless reducing agent used has a molecular weight selected from (a) between 35 and 10,000; and (b) between 1 and $<35$ (preferably between 10 and $<35$); wherein traceless reducing agent having a molecular weight between 10 and $<35$ has a molecular formula with $\leq 1$ nitrogen atom. Optionally, the traceless reducing agent used in the preparation of the selenium ink of the present invention has a molecular formula with $\leq 1$ nitrogen atom. Preferably, the traceless reducing agent used in the preparation of the selenium ink of the present invention is selected from formic acid; ammonium formate; ammonium oxalates; oxalic acid; formamides (e.g., dimethylformamide); lactates; carbon monoxide; hydrogen; isoascorbic acid; sulfur dioxide; acetaldehyde; aldehydes (e.g., formaldehyde, ethylaldehyde, propylaldehyde, heptaldehyde) and combinations thereof. More preferably, the traceless reducing agent used is selected from ammonium formate, formic acid, ammonium oxalate, heptaldehyde and oxalic acid. Most preferably, the traceless reducing agent used is selected from ammonium formate and formic acid.

Without wishing to be bound by theory, it is believed that the ratio of $Se^0$ to $Se^{1-}$ deposited on a substrate upon decomposition of the selenium ink can be manipulated through judicious selection of the number of molar equivalents of traceless reducing agent used relative to selenium in preparing the selenium ink. The number of molar equivalents of the traceless reducing agent used relative to selenium in the preparation of the selenium ink of the present invention is selected to optimize the electrical properties of the semiconductor features to be manufactured using the selenium ink. Preferably, the selenium ink will deposit a combination of $Se^0$ and $Se^{1-}$ on the substrate upon decomposition of the selenium ink. Without wishing to be bound by theory, it is believed that the annealing mechanism used in the formation of CIGS materials are different when switching between a negatively charged selenium (e.g., $Se^{2-}$, $Se^{1-}$) and $Se^0$. It is believed that a negatively charged selenium species may offer advantages in the annealing process. Optionally, the number of molar equivalents of traceless reducing agent relative to selenium used in the preparation of the selenium ink of the present invention is 2 to 40. Optionally, the number of molar equivalents of traceless reducing agent relative to selenium used in the preparation of the selenium ink of the present invention is 2 to 20.

Liquid carrier used in the preparation of the selenium ink of the present invention is preferably a nitrogen containing solvent. Optionally, the liquid carrier is a liquid amine having a formula $NR_3$, wherein each R is independently selected from a H, a $C_{1-10}$ alkyl group, a $C_{6-10}$ aryl group and a $C_{1-10}$ alkylamino group. Optionally, the liquid carrier used in the preparation of the selenium ink of the present invention is selected from ethylene diamine, diethylenetriamine, n-butylamine, n-hexylamine, octylamine, 2-ethyl-1-hexylamine, 3-amino-1-propanol, pyridine, pyrrolidine, and tetramethylguanidine. Preferably, the liquid carrier used in the preparation of the selenium ink of the present invention is selected from ethylene diamine, diethylenetriamine, n-hexylamine, pyrrolidine and n-butylamine. More preferably the liquid carrier used in the preparation of the selenium ink of the present invention is selected from ethylene diamine, diethylenetriamine, pyrrolidine and n-butylamine. Most preferably the liquid carrier used in the preparation of the selenium ink of the present invention is selected from ethylene diamine and diethylenetriamine.

The selenium ink of the present invention can, optionally, further comprise a cosolvent. Cosolvents suitable for use with the present invention are miscible with the liquid carrier. Preferred cosolvents exhibit a boiling point within 30° C. of the boiling point of the liquid carrier.

The selenium ink of the present invention can, optionally, further comprise at least one optional additive selected from a dispersant, a wetting agent, a polymer, a binder, an antifoaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant (e.g., sodium to improve electrical performance of CIGS materials). Optional additives can be incorporated into the selenium ink of the present invention to, for example, facilitate increased shelf life, to improve flow characteristics to facilitate the method of application to a substrate (e.g., printing, spraying), to modify the wetting/spreading characteristics of the ink onto the substrate, to enhance the compatibility of the selenium ink with other inks used to deposit other components on the substrate (e.g., other constituents of a CIGS material, such as Cu, In, Ga, and S), and to modify the decomposition temperature of the selenium ink.

A method of preparing the selenium ink of the present invention, comprises: providing a selenium; providing a traceless reducing agent; providing a liquid carrier; combining the selenium, the traceless reducing agent and the liquid carrier to form a (counterion)selenide complex; wherein the (counterion)selenide complex is stably dispersed in the liquid carrier; and, wherein the selenium ink is hydrazine free and hydrazinium free. While not wishing to be bound by theory, it is believed that the reaction between the selenium, the traceless reducing agent and the liquid carrier proceeds as follows:

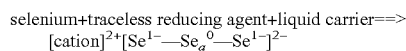
selenium+traceless reducing agent+liquid carrier==> [cation]$^{2+}$[Se$^{1-}$—Se$_a{}^0$—Se$^{1-}$]$^{2-}$ For example,

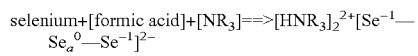
selenium+[formic acid]+[NR$_3$]==>[HNR$_3$]$_2{}^{2+}$[Se$^{-1}$—Se$_a{}^0$—Se$^{-1}$]$^{2-}$ During preparation of the selenium ink, selection of the number of molar equivalents of the traceless reducing agent relative to selenium provides control over the levels of Se$^0$ and Se$^{1-}$ produced. Without wishing to be bound by theory, formic acid can break down by two different processes, acting as a two electron reducing agent. In one process, formic acid breaks down to yield $CO_2$ and $H_2$ providing a two electron reduction potential. In one process, formic acid breaks down to yield CO and $H_2O$ providing a two electron reduction potential. Without wishing to be bound by theory, it is believed possible that with some traceless reducing agent and liquid carrier combinations (e.g., formic acid, oxalic acid or carbon monoxide traceless reducing agent with an amine liquid carrier), the reaction can proceed according to a Sonoda-type mechanism (N. Sonoda, *Selenium Assisted Caronylation with Carbon-Monoxide*, PURE AND APPLIED CHEMISTRY, vol. 65, pp. 699-706). Using a Sonoda-type mechanism, a species such as (ammonium counterion)$^+$(Se—CO—NR$_2$)$^-$ is formed, which can effectively breakdown to an (ammonium counterion)$^+$ selenide complex through loss of a urea NR$_2$—CO—NR$_2$ after reaction with another amine molecule.

Preferably, the selenium used in making the selenium ink of the present invention is selenium powder.

Preferably, the selenium used in making the selenium ink of the present invention contributes 1 to 50 wt %, 1 to 20 wt %, 1 to 5 wt %, 4 to 15 wt %, or 5 to 10 wt % of the selenium ink produced.

Optionally, the method of preparing the selenium ink of the present invention, further comprises: providing a cosolvent; and, combining the cosolvent with the liquid carrier.

Optionally, the method of preparing the selenium ink of the present invention, further comprises: providing at least one optional additive; and, combining the at least one optional additive with the liquid carrier; wherein the at least one optional additive is selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant.

Preferably, in the method of preparing the selenium ink of the present invention, the selenium and the liquid carrier are combined by adding the liquid carrier to the selenium. More preferably, the selenium and liquid carrier are combined using inert techniques, followed with continuous agitation and heating. The method of agitation selected can influence the particle size of the resulting (counterion)selenide complex in the selenium ink prepared. The method of agitation used can optionally be selected from wet milling, high shear dispersion and sonication. Preferably, the liquid carrier is maintained at a temperature of 20 to 240° C. during the combining of the liquid carrier and the selenium powder. Optionally, the liquid carrier and selenium can be heated above the melting point of selenium (220° C.) during the combining process.

Preferably, in the method of preparing the selenium ink of the present invention, the timing of the addition of the traceless reducing agent depends on the physical state of the traceless reducing agent used. For solid traceless reducing agents, the solid traceless reducing agent is preferably combined with the selenium before addition of the liquid carrier. For liquid traceless reducing agents, the liquid traceless reducing agent is preferably added to the combined selenium and liquid carrier.

When using a liquid traceless reducing agent, the method of preparing the selenium ink of the present invention optionally further comprises heating the combined selenium and liquid carrier before adding the liquid traceless reducing agent. Preferably, the method of preparing the selenium ink of the present invention optionally further comprises: heating the combined liquid carrier and selenium powder before and during the addition of any liquid traceless reducing agent. More preferably, the combined liquid carrier and selenium powder are maintained at a temperature of 20 to 240° C. during the addition of the traceless reducing agent. Optionally, any liquid traceless reducing agents are added to the combined selenium and liquid carrier by gradually adding the liquid traceless reducing agent to the combined selenium and liquid carrier with continuous agitation, heating and reflux.

Preferably, in the method of preparing the selenium ink of the present invention, the traceless reducing agent used is selected from reducing agents having a molecular weight selected from (a) $\geq 35$ and (b) <35; wherein traceless reducing agent having a molecular weight <35 has a molecular formula with $\leq 1$ nitrogen atom. More preferably, the traceless reducing agent used has a molecular weight selected from (a) between 35 and 10,000; and (b) between 10 and <35; wherein traceless reducing agent having a molecular weight between 10 and <35 has a molecular formula with $\leq 1$ nitrogen atom. Optionally, the traceless reducing agent used has a molecular formula with $\leq 1$ nitrogen atom. Preferably, the traceless reducing agent used in the preparation of the selenium ink is selected from formic acid; ammonium formate; ammonium oxalates; oxalic acid; formamides (e.g., dimethylformamide); lactates; carbon monoxide; hydrogen; isoascorbic acid; sulfur dioxide; acetaldehyde; aldehydes (e.g., formaldehyde, ethylaldehyde, propylaldehyde, heptaldehyde) and combinations thereof. More preferably, the traceless reducing agent used is selected from ammonium formate, formic acid, ammonium oxalate, heptaldehyde and oxalic acid. Most preferably, the traceless reducing agent used is selected from ammonium formate and formic acid. Without wishing to be bound by theory, it is believed that the traceless reducing agent acts to reduce selenium while producing volatile byproducts. For example, formic acid and oxalic acid produce water, CO, $H_2$ and $CO_2$ while reducing compounds. Carbon monoxide produces O=C=Se. Aldehydes produce volatile carboxylates.

In the method of preparing the selenium ink of the present invention, the liquid carrier used is an nitrogen containing solvent. Optionally, in the method of preparing the selenium ink of the present invention, the liquid carrier used is a liquid amine having a formula $NR_3$, wherein each R is independently selected from a H, a $C_{1-10}$ alkyl group, a $C_{6-10}$ aryl group and a $C_{1-10}$ alkylamino group. Optionally, in the method of preparing the selenium ink of the present invention, the liquid carrier used is selected from ethylene diamine, diethylenetriamine, n-butylamine, n-hexylamine, octylamine, 2-ethyl-1-hexylamine, 3-amino-1-propanol, pyridine, pyrrolidine, and tetramethylguanidine. Preferably, the liquid carrier used in the preparation of the selenium ink of the present invention is selected from ethylene diamine, diethylenetriamine, n-hexylamine, pyrrolidine and n-butylamine. More preferably the liquid carrier used in the preparation of the selenium ink of the present invention is selected from ethylene diamine, diethylenetriamine, pyrrolidine and n-butylamine. Most preferably the liquid carrier used in the preparation of the selenium ink of the present invention is selected from ethylene diamine and diethylenetriamine.

The selenium ink of the present invention can be used in the preparation of a variety of semiconductor materials comprising selenium (e.g., thin layer transistors, solar cells, electrophotography components, rectifiers, photographic exposure meters) and in the preparation of chalcogenide containing phase change memory devices.

The method of depositing selenium on a substrate using a selenium ink of the present invention, comprises: providing a substrate; providing a selenium ink of the present invention; applying the selenium ink to the substrate forming a selenium precursor on the substrate; treating the selenium precursor to remove the liquid carrier depositing selenium on the substrate; wherein the selenium deposited on the substrate is a mixture of $Se^0$ and $Se^{1-}$. Optionally, the selenium deposited on the substrate contains 5 to 50 wt % $Se^{1-}$.

The selenium ink of the present invention can be deposited onto a substrate using conventional processing techniques such as wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition and spray deposition.

Preferably, when treating the selenium precursor to remove the liquid carrier, the selenium precursor is heated to a temperature above the boiling point temperature of the liquid carrier. Optionally, the selenium precursor is heated to a temperature of 5 to 200° C. Optionally, the selenium precursor is heated to a temperature of 5 to 200° C. under vacuum. Optionally, the selenium precursor is heated to a temperature above 220° C., both melting the selenium and volatilizing the liquid carrier to facilitate its removal.

A method of the present invention for preparing a Group 1a-1b-3a-6a material, comprises: providing a substrate; optionally, providing a Group 1a source comprising sodium; providing a Group 1b source; providing a Group 3a source; optionally providing a Group 6a sulfur source; providing a Group 6a selenium source, wherein the Group 6a selenium source includes a selenium ink of the present invention; forming a Group 1a-1b-3a-6a precursor material on the substrate by optionally using the Group 1a source to apply sodium to the substrate, using the Group 1b source to apply a Group 1b material to the substrate, using the Group 3a source to apply a Group 3a material to the substrate, optionally using the Group 6a sulfur source to apply a sulfur material to the substrate and using the Group 6a selenium source to apply a selenium material to the substrate; treating the precursor material to form a Group 1a-1b-3a-6a material having a formula $Na_L X_m Y_n S_p Se_q$; wherein X is at least one Group 1b material selected from copper and silver, preferably copper; Y is at least one Group 3a material selected from aluminum, gallium and indium, preferably indium and gallium; $0 \leq L \leq 0.75$; $0.25 \leq m \leq 1.5$; n is 1; $0 \leq p < 2.5$; and, $0 < q \leq 2.5$. Preferably, $0.5 \leq (L+m) \leq 1.5$ and $1.8 \leq (p+q) \leq 2.5$. Preferably, Y is $(In_{1-b}Ga_b)$, wherein $0 \leq b \leq 1$. More preferably, the Group 1a-1b-3a-6a material is according to the formula $Na_L Cu_m In_{(1-d)} Ga_d S_{(2+e)(1-f)} Se_{(2+e)f}$; wherein $0 \leq L \leq 0.75$, $0.25 \leq m \leq 1.5$, $0 \leq d \leq 1$, $-0.2 \leq e \leq 0.5$, $0 < f \leq 1$; wherein $0.5 \leq (L+m) \leq 1.5$ and $1.8 \leq \{(2+e)f + (2+e)(1-f)\} \leq 2.5$. Optionally, one or more of the Group 1a source, Group 1b source, Group 3a source, Group 6a sulfur source and the selenium ink of the present invention are combined. The components of the precursor material can be treated by known methods to form the Group 1a-1b-3a-6a material having formula $Na_L X_m Y_n S_p Se_q$. The components of the precursor material can be treated individually or in various combinations. For example, a selenium ink of the present invention and a Group 1b material source can be sequentially- or co-deposited on a substrate, followed by heating to a temperature of 200 to 650° C. for 0.5 to 60 minutes, followed by deposition of additional selenium ink of the present invention and at least one Group 3a material source onto the substrate, followed by heating to a temperature of 200 to 650° C. for 0.5 to 60 minutes. In another approach, the Group 1a, 1b, 3a and 6a materials are all applied to the substrate before annealing. Annealing temperatures can range from 200 to 650° C. with annealing times of 0.5 to 60 minutes. Optionally, additional Group 6a material can be introduced during the annealing process in the form of at least one of selenium ink of the present invention, selenium powder and hydrogen selenide gas. The precursor materials can optionally be heated to the annealing temperature by use of a rapid thermal processing protocol, such as with the use of a high-powered quartz lamp, a laser or microwave heating methods. The precursor materials can optionally be heated to the annealing temperature using traditional heating methods, for example in a furnace.

A method of the present invention for preparing a CIGS material, comprises: providing a substrate; providing a copper source; optionally, providing an indium source; optionally, providing a gallium source; optionally, providing a sulfur source and providing a selenium ink of the present invention; forming at least one CIGS precursor layer on the substrate by depositing a copper material on the substrate using the copper source, optionally depositing an indium material on the substrate using the indium source, optionally depositing a gallium material on the substrate using the gallium source, optionally depositing a sulfur material on the substrate using the sulfur source and depositing a selenium material on the substrate using the selenium ink; treating the at least one CIGS precursor layer to form a CIGS material having a formula $Cu_v In_w G_x Se_y S_z$; wherein $0.5 \leq v \leq 1.5$ (preferably $0.88 \leq v \leq 0.95$), $0 \leq w \leq 1$ (preferably $0.68 \leq w \leq 0.75$, more preferably w is 0.7), $0 \leq x \leq 1$ (preferably $0.25 \leq x \leq 0.32$, more preferably x is 0.3), $0 < y \leq 2.5$; and, $0 \leq z < 2.5$. Preferably $(w+x)=1$ and $1.8 \leq (y+z) \leq 2.5$. More preferably, the CIGS material prepared has a formula $CuIn_{1-b} Ga_b Se_{2-c} S_c$, wherein $0 \leq b \leq 1$ and $0 \leq c < 2$. The components of the CIGS precursor layer(s) can be treated by known methods to form the CIGS material having formula $Cu_v In_w G_x S_y Se_z$. When multiple CIGS precursor layers are applied, the layers can be treated individually or in various combinations. For example, a selenium ink of the present invention and a copper source can be sequentially- or co-deposited on a substrate to form a CIGS precursor layer, followed by heating of the precursor layer to a temperature of 200 to 650° C. for 0.5 to 60 minutes; followed by deposition onto the substrate of another CIGS precursor layer using more selenium ink of the present invention and at least one of an indium source and a gallium source, followed by heating to a temperature of 200 to 650° C. for 0.5 to 60 minutes. In another approach, the components of the CIGS precursor layer(s) are all applied to the substrate before annealing. Annealing temperatures can range from 200 to 650° C. with annealing times of 0.5 to 60 minutes. Optionally, additional selenium can be introduced during the annealing process in the form of at least one of selenium ink of the present invention, selenium powder and hydrogen selenide gas. The CIGS precursor layer(s) can optionally be heated to the annealing temperature by use of a rapid thermal processing protocol, such as with the use of a high-powered quartz lamp, a laser or microwave heating methods. The CIGS precursor layer(s) can optionally be heated to the annealing temperature using traditional heating methods, for example in a furnace.

Optionally, at least two of the copper source, the indium source, the gallium source, the sulfur source and the selenium ink can be combined before using them to deposit material on the substrate. Optionally, at least three of the copper source, the indium source, the gallium source, sulfur source and the selenium ink can be combined before using them to deposit material on the substrate. Optionally, the copper source, the indium source, the gallium source, the sulfur source and the selenium ink are combined before using them to deposit material on the substrate.

Optionally, at least two of the copper material, indium material, gallium material, sulfur material and selenium material are codeposited on the substrate to provide the desired CIGS material composition. The term "codeposited" as used herein and in the appended claims means that the copper material, indium material, gallium material, sulfur material and selenium material that are being codeposited on the substrate are simultaneously deposited on the substrate without the prior combination of the corresponding material sources.

To facilitate the combination of two or more material sources prior to deposition on a substrate or to facilitate the codeposition of two or more material sources, the material sources used are preferably formulated to exhibit similar decomposition temperatures. Preferably, the decomposition temperatures (i.e., boiling point temperatures for the liquid carrier and liquid vehicle(s) in the material sources) of the combined or codeposited material sources are within 50° C., more preferably within 25° C.

Group 1a sources suitable for use in accordance with the present invention include any conventional vehicles for depositing sodium (a Group 1a material) on a substrate using liquid deposition techniques, vacuum-evaporation techniques, chemical vapor deposition techniques, sputtering techniques or any other conventional process for depositing sodium on a substrate. Preferably, the Group 1a source can be incorporated with one or more of the Group 1b source, the Group 3a source, the Group 6a sulfur source or the Group 6a selenium source. That is, sodium can be incorporated into one or more of the Group 1b source, the Group 3a source, the Group 6a sulfur source or the Group 6a selenium source. Alternatively, the sodium may be deposited on a substrate using a separate Group 1a source. For example, sodium salts can be suspended in a suitable liquid carrier for deposition on a substrate. Sodium salts can be selected from $Na_2Se_4$, $Na_2S$, $Na_2Se$, NaHS, NaHSe, and sodium salts of metal chalcogenide clusters.

Group 1b sources suitable for use in accordance with present invention include any conventional vehicles for depositing a Group 1b material on a substrate using liquid deposition techniques, vacuum-evaporation techniques, chemical vapor deposition techniques, sputtering techniques or any other conventional process for depositing a Group 1b material on the substrate. Preferably, the Group 1b material includes at least one of copper and silver; more preferably copper. Copper sources suitable for use in accordance with the present invention include any conventional vehicles for depositing copper metal onto a substrate using any conventional copper deposition process. Preferably, the copper source includes a copper ink comprising a liquid vehicle and at least one of suspended Cu metal, Cu nanoparticles, copper selenide compounds, copper sulfide compounds, copper oxide, cuprous oxide, organometallic compounds including Cu—Se bonds, organometallic compounds including Cu—S bonds, organometallic compounds including Cu—O bonds, ammonium-copper complexes, copper amidinate complexes, copper guanidinate complexes, copper formate, cuprous formate, copper acetylacetonate, copper ethylhexanoates and copper hexafluoroacetylacetonate; preferably copper formate.

Group 3a sources suitable for use in accordance with the present invention include any conventional vehicles for depositing a Group 3a material on a substrate using liquid deposition techniques, vacuum-evaporation techniques, chemical vapor deposition techniques, sputtering techniques or any other conventional process for depositing a Group 3a material onto a substrate. Preferably, the Group 3a material includes at least one of gallium, indium and aluminum; more preferably gallium and indium. Optionally, the Group 3a source comprises two or more Group 3a sources selected from a gallium source, an indium source and an aluminum source; preferably a gallium source and an indium source. Gallium sources suitable for use in accordance with the present invention include any conventional vehicles for depositing gallium metal onto a substrate using any conventional gallium deposition process. Preferably, the gallium source includes a gallium ink comprising a liquid vehicle and at least one of suspended gallium metal, gallium nanoparticles, gallium selenide compounds, gallium sulfide compounds, gallium oxide compounds, organometallic compounds including Ga—Se bonds, organometallic compounds including Ga—S bonds, organometallic compounds including Ga—O bonds, ammonium-gallium complexes, gallium amidinates, gallium acetylacetonate, gallium ethylhexanoates, and gallium hexafluoroacetylacetonate. Indium sources suitable for use in accordance with the present invention include any conventional vehicles for depositing indium onto a substrate using any conventional indium deposition process. Preferably, the indium source includes an indium ink comprising a liquid vehicle and at least one of suspended indium metal, indium nanoparticles, indium selenide compounds, indium sulfide compounds, indium oxide compounds, organometallic compounds including In—Se bonds, organometallic compounds including In—S bonds, organometallic compounds including In—O bonds, ammonium-indium complexes, indium amidinates, indium acetylacetonate, indium ethylhexanoates and indium hexafluoroacetylacetonate.

Liquid vehicles used in the copper source, the gallium source and the indium source can include amines, amides, alcohols, water, ketones, unsaturated hydrocarbons, saturated hydrocarbons, mineral acids, organic acids, organic bases; preferably alcohols, amines, amides, water, ketone, ether, aldehydes and alkenes.

Group 6a sulfur sources suitable for use in accordance with the present invention include any conventional vehicles for depositing sulfur on a substrate using liquid deposition techniques, vacuum-evaporation techniques, chemical vapor deposition techniques, sputtering techniques or any other conventional process for depositing sulfur onto a substrate. Optionally, the group 6a sulfur source includes a sulfur ink comprising sulfur dissolved in a liquid vehicle. For example, sulfur readily dissolves in amine solvents to form a sulfur ink. Optionally, the group 6a sulfur source can be incorporated with one or more of the Group 1b source, the Group 3a source or the Group 6a selenium source. For example, solution based precursors of sulfur can include metal sulfides, such as, copper sulfide, indium sulfide and gallium sulfide. Accordingly, a given source can comprise both a group 6a sulfur source and a group 1b source (e.g., copper sulfide ink) or group 3a source (e.g., an indium sulfide ink, gallium sulfide ink). Optionally, nanoparticles of sulfur can be formed and used as a group 6a sulfur source to deposit sulfur.

The substrate used can be selected from conventional materials used in conjunction with the preparation of a semiconductor comprising selenium or in conjunction with chalcogenide containing phase change memory devices. For use in some applications, the substrate can be preferably selected from molybdenum, aluminum and copper. For use in the preparation of CIGS materials for use in photo voltaic devices, the substrate is most preferably molybdenum. In some applications, the molybdenum, aluminum or copper substrate can be a coating on a carrier substance, such as, glass, foil, and plastic (e.g., polyethylene terephthalate and polyimides). Optionally, the substrate is sufficiently flexible to facilitate roll-to-roll production of CIGS materials for use in photo voltaic devices.

In the method of the present invention for forming a CIGS material on a substrate, 1 to 20 CIGS precursor layers are deposited on the substrate to form the CIGS material. Preferably 2 to 8, CIGS precursor layers are deposited on the substrate to form the CIGS material. The individual CIGS precursor layers each comprise at least one of a copper, silver, gallium, indium, sulfur and selenium. Optionally, at least one of the CIGS precursor layers comprise at least one Group 1b material selected from copper and silver; at least one Group 3a material selected from gallium and indium and at least one Group 6a material selected from sulfur and selenium.

Using the method of depositing selenium of the present invention, it is possible to provide uniform or graded semiconductor films comprising selenium (e.g., a CIGS material). For example, a graded CIGS material can be prepared by depositing varying concentrations of the components deposited (i.e., by depositing multiple layers of the precursor materials in different compositions). In the preparation of CIGS materials it is sometimes desirable to provide graded films (e.g., with respect to Ga concentration). It is conventional to provide a graded Ga/(Ga+In) ratio as a function of depth in a CIGS material for use in photo voltaic devices to facilitate improved separation of the photogenerated charge carriers and to facilitate reduced recombination at the back contact. Accordingly, it is believed to be desirable to tailor the CIGS material composition to achieve the desired gain structure and the highest efficiency photo voltaic device characteristics.

Some embodiments of the present invention will now be described in detail in the following Examples.

Examples 1-12

Selenium Ink Synthesis

Selenium inks were prepared using the components and amounts identified in Table 1 using the following method. Selenium powder was weighed out into a reaction vessel in air. For Examples that used a solid traceless reducing agent (e.g., ammonium formate), the solid traceless reducing agent was then weighed into the reaction vessel. The reaction vessel was then purged with nitrogen. The liquid carrier was then added without agitation to the reaction vessel using inert techniques in a glove box. After addition of the liquid carrier, agitation was initiated using a magnetic stir bar. For Examples that used a liquid traceless reducing agent, the liquid traceless reducing agent was then added to the reaction vessel using inert techniques (i.e., via a syringe through a rubber septa). The contents of the reaction vessel were then treated under the reaction conditions noted in Table 1. Formation of the selenium ink was indicated by a distinctive brown color formation in the liquid carrier and a lack of solids on the bottom of the reaction vessel. The selenium inks formed were stable (i.e., no solids were observed to collect in the bottom of their container after sitting overnight, ~16 hours, without agitation following synthesis). In addition, the selenium inks formed were easily filtered through a 1.2 micron glass syringe filter and a 0.45 micron PTFE syringe filter, with no evidence of clogging or observed residual solids. Note the selenium inks are air sensitive and will decompose upon exposure to air. Accordingly, the selenium inks were prepared and stored in a nitrogen atmosphere.

TABLE 1

| Ex. | Se (g) | Traceless Reducing Agent ("TRA") | TRA liq.-(l) sol.-(s) | Mass TRA (g) | Liquid Carrier ("LC") | Mass LC (g) | React. Cond. | Observ. |
|---|---|---|---|---|---|---|---|---|
| 1 | 0.438 | ammonium formate | (s) | 0.0874 | ethylene diamine | 2.98 | A | D |
| 2 | 0.584 | ammonium formate | (s) | 0.117 | ethylene diamine | 2.80 | A | D |
| 3 | 0.729 | ammonium formate | (s) | 0.146 | ethylene diamine | 2.63 | A | D |
| 4 | 0.585 | formic acid | (l) | 0.057 | ethylene diamine | 11.4 | B | D |
| 5 | 0.539 | oxalic acid | (s) | 0.103 | ethylene diamine | 11.4 | B | D |
| 6 | 0.150 | formic acid | (l) | 0.018 | N,N,N',N'-tetramethyl guanidine | 4.83 | C | D |
| 7 | 0.150 | lactic acid | (l) | 0.0343 | N,N,N',N'-tetramethyl guanidine | 4.82 | C | G |
| 8 | 0.150 | heptaldehyde | (l) | 0.0434 | N,N,N',N'- | 4.81 | C | D |

TABLE 1-continued

| Ex. | Se (g) | Traceless Reducing Agent ("TRA") | TRA liq.-(l) sol.-(s) | Mass TRA (g) | Liquid Carrier ("LC") | Mass LC (g) | React. Cond. | Observ. |
|---|---|---|---|---|---|---|---|---|
| 9 | 0.300 | formic acid | (l) | 0.0350 | tetramethyl guanidine pyrrolidine | 9.66 | E | D |
| 10 | 4.00 | formic acid | (l) | 0.580 | ethylene diamine | 5.41 | E | H |
| 11 | 0.480 | formic acid | (l) | 0.020 | ethylene diamine | 9.50 | F | D |
| 12 | 0.472 | formic acid | (l) | 0.028 | ethylene diamine | 9.50 | F | D |

A. Reaction vessel & contents heated on hot plate set at 120° C. for 6.5 hours; then raised hot plate set point temperature to 130° C. and continued heating for 2 more hours.
B. Continued agitation with reflux until all solids dissolved.
C. Heated contents of reaction vessel on a hot plate set at 120° C. for 6 hours.
D. No solids were observed remaining on the bottom of reaction vessel upon completion of reaction.
E. Continued agitation with reflux for 2 hours.
F. Continued agitation with reflux for 3 hours.
G. Reaction incomplete; however, some selenium dissolution was observed.
H. No solids were observed remaining on the bottom of the reaction vessel upon completion of reaction. The product selenium ink was noticeably viscous.

Examples 13-26

Filtration

The selenium inks prepared according to the Examples noted in Table 2 were filtered through a 1.2 micron glass syringe filter and a 0.45 micron PTFE syringe filter as noted in Table 2 after sitting without agitation on a shelf at room temperature and pressure for the period noted in Table 2 following synthesis of the ink with the result noted in Table 2.

TABLE 2

| Ex. # | Se Ink according to Ex. # | Hold Time Before Filtration | Filter size | Result |
|---|---|---|---|---|
| 13 | 4 | 12 weeks | 0.45 μm | I |
| 14 | 5 | 11.5 weeks | 0.45 μm | I |
| 15 | 6 | 16 hours | 1.2 μm | I |
| 16 | 8 | 16 hours | 1.2 μm | I |
| 17 | 9 | 16 hours | 1.2 μm | I |
| 18 | 10 | 16 hours | 1.2 μm | I |
| 19 | 11 | 16 hours | 1.2 μm | I |
| 20 | 12 | 16 hours | 1.2 μm | I |
| 21 | 6 | 25 days | 1.2 μm | I |
| 22 | 8 | 25 days | 1.2 μm | I |
| 23 | 9 | 25 days | 1.2 μm | K |
| 24 | 10 | 25 days | 1.2 μm | L |
| 25 | 11 | 21 days | 1.2 μm | I |
| 26 | 12 | 21 days | 1.2 μm | I |

I. No aggregation or settling observed following the noted hold time. The selenium ink passed through the filter with no hold up (i.e., all material passed through the filter).
K. About 1 to 2 wt % held up in the filter. No resistance felt during filtration.
L. About 5 to 10 wt % held up in the filter. Some resistance felt during filtration.

Example 27

Preparation of Copper Selenide Film on Copper Substrate

Procedure was performed in a glove box under a nitrogen atmosphere. A copper foil substrate was preheated on a hotplate set at 100° C. Several drops of the selenium ink prepared according to Example 4 were deposited on the preheated copper foil substrate. The hotplate set point temperature was then raised to 220° C.; held there for five minutes; then raised to 298° C.; and held there for five minutes. The substrate was then removed from the hotplate and allowed to cool. The product was analyzed by x-ray diffraction (2-theta scan) using a Rigaku D/MAX 2500 at 50 kV/200 mA of nickel filtered copper Kα radiation. The sample was scanned from 5 to 90 degrees of 2θ in steps of 0.03 degrees at 0.75 degrees/minute. Reflection geometry was used and the sample was rotated at 20 RPM. The scan output was then compared with scans for compounds in standard crystallography databases to verify that copper selenide was formed on the surface of the substrate.

Example 28

Preparation of Copper Selenide Film on Molybdenum Substrate

Procedure was performed in a glove box under a nitrogen atmosphere. A molybdenum foil substrate was preheated on a hotplate set at 100° C. A copper ink was prepared by dissolving 1.59 g of copper (II) formate in 7.37 g of n-butylamine with stirring at 40° C. until the copper (II) formate dissolved. Three drops of the selenium ink prepared according to Example 4 was deposited with two drops of the copper ink on the molybdenum foil substrate. The hotplate set point temperature was then raised to 220° C.; held there for five minutes; then raised to 298° C.; and held there for five minutes. The substrate was then removed from the hotplate and allowed to cool. The product was analyzed by x-ray detraction (2-theta scan) using same equipment and settings noted in Example 27. The scan output was then compared with scans for compounds in standard crystallography databases to verify that copper selenide was formed on the surface of the substrate.

Example 29

Preparation of Copper Selenide Film on Molybdenum Substrate

Procedure was performed in a glove box under a nitrogen atmosphere. A molybdenum foil substrate was preheated on a hotplate set at 100° C. A copper ink was prepared by dissolving 0.35 g of copper (II) ethylhexanoate in 6.65 g of hexylamine with stirring at 40° C. until the copper (II) ethylhexanoate dissolved. One drop of the selenium ink prepared according to Example 4 was deposited with four drops of the copper ink on the molybdenum foil substrate. The hotplate set point temperature was then raised to 220° C.; held there for five minutes; then raised to 298° C.; and held there for five minutes. The substrate was then removed from the hotplate and allowed to cool. The product was analyzed by x-ray defraction (2-theta scan) using same equipment and settings noted in Example 27. The scan output was then compared with scans for compounds in standard crystallography databases to verify that copper selenide was formed on the surface of the substrate.

Example 30

Preparation of Copper Selenide Film on Molybdenum Substrate

Procedure was performed in a glove box under a nitrogen atmosphere. A molybdenum foil substrate was preheated on a hotplate set at 100° C. A copper ink was prepared by dissolving 0.5 g of copper (II) acetylacetonate in 9.5 g of ethylene diamine with stirring at 40° C. until the copper (II) acetylacetonate dissolved. One drop of the selenium ink prepared according to Example 4 was deposited with four drops of the copper ink on the molybdenum foil substrate. The hotplate set point temperature was then raised to 220° C.; held there for five minutes; then raised to 298° C.; and held there for five minutes. The substrate was then removed from the hotplate and allowed to cool. The product was analyzed by x-ray defraction (2-theta scan) using same equipment and settings noted in Example 27. The scan output was then compared with scans for compounds in standard crystallography databases to verify that copper selenide was formed on the surface of the substrate.

We claim:

1. A selenium ink, comprising:
    a reaction product of:
        selenium;
        a traceless reducing agent;
        and a liquid carrier;
    wherein the selenium ink exhibits a selenide content of I to 50 wt %;
    wherein the selenium ink is a stable dispersion and wherein the selenium ink contains less than 100 ppm hydrazine and less than 100 ppm hydrazinium complexed with selenium; and
    wherein the reaction product is a counterion-selenide complex dispersed in the liquid carrier; wherein the counterion-selenide complex comprises selenium complexed with a counterion selected from an ammonium counterion and an amine counterion.

2. The selenium ink of claim 1, wherein the traceless reducing agent is selected from reducing agents having a molecular weight of $\geq 35$ and reducing agents having a molecular weight of $<35$; wherein the traceless reducing agent having a molecular weight $<35$ has a molecular formula with $\leq 1$ nitrogen atom.

3. The selenium ink of claim 1, wherein the traceless reducing agent is selected from the group consisting of formic acid; ammonium formate; ammonium oxalates; oxalic acid; formamides; lactates; carbon monoxide; hydrogen; isoascorbic acid; sulfur dioxide; acetaldehyde; aldehydes and combinations thereof.

4. The selenium ink of claim 1, wherein the liquid carrier is a liquid amine having a formula $NR_3$, wherein each R is independently selected from the group consisting of a H, a $C_{1-10}$ alkyl group, a $C_{6-10}$ aryl group and a $C_{1-10}$ alkylamino group.

5. The selenium ink of claim 1, wherein the liquid carrier is selected from the group consisting of ethylene diamine, diethylenetriamine, n-butylamine, n-hexylamine, octylamine, 2-ethyl-1-hexylamine, 3-amino-1-propanol, pyridine, pyrrolidine, and tetramethylguanidine.

6. A method for depositing selenium on a substrate, comprising:
    providing a substrate;
    providing a selenium ink according to claim 1;
    applying the selenium ink to the substrate forming a selenium precursor on the substrate;
    treating the selenium precursor to remove the liquid carrier depositing selenium on the substrate; wherein the selenium deposited on the substrate is a mixture of $Se^0$ and $Se^{1-}$.

7. A method for preparing a Group 1a-1b-3a-6a material, comprising:
    providing a substrate;
    optionally, providing a Group 1a source comprising sodium;
    providing a Group 1b source;
    providing a Group 3a source;
    optionally, providing a Group 6a sulfur source;
    providing a Group 6a selenium source, wherein the Group 6a selenium source includes a selenium ink according to claim 1;
    forming at least one Group 1a-1b-3a-6a precursor material on the substrate by optionally using the Group 1a source to apply sodium to the substrate, using the Group 1b source to apply a Group 1b material to the substrate, using the Group 3a source to apply a Group 3a material to the substrate, optionally using the Group 6a sulfur source to apply a sulfur material to the substrate and using the Group 6a selenium source to apply a selenium material to the substrate;
    treating the precursor material to form a Group 1a-1b-3a-6a material having a formula $Na_L X_m Y_n S_p Se_q$;
    wherein X is at least one Group 1b element selected from copper and silver; Y is at least one Group 3a element selected from aluminum, gallium and indium; $0 \leq L \leq 0.75$; $0.25 \leq m \leq 1.5$; n is 1; $0 \leq p < 2.5$; $0 < q \leq 2.5$; and, $1.8 \leq (p+q) \leq 2.5$.

8. A method of preparing a selenium ink, comprising:
    providing a selenium;
    providing a traceless reducing agent;
    providing a liquid carrier;
    combining the selenium and the liquid carrier;
    adding the traceless reducing agent to the combined selenium and liquid carrier to form mixture; and,
    heating the mixture with agitation to convert the selenium to a (counterion)selenide complex forming the selenium ink;
    wherein the counterion-selenide complex is stably dispersed in the liquid carrier; wherein the counterion-selenide complex comprises selenium complexed with a counterion selected from an ammonium counterion and an amine counterion;
    wherein the selenium ink exhibits a selenide content of I to 50 wt %; and, wherein the selenium ink contains less than 100 ppm hydrazine and less than 100 ppm hydrazinium complexed with selenium.

9. The method of claim 8, wherein 2 to 40 molar equivalents of the traceless reducing agent is provided relative to selenium.

* * * * *